United States Patent
Kim et al.

(10) Patent No.: US 9,484,516 B2
(45) Date of Patent: Nov. 1, 2016

(54) METHOD FOR PREPARING ELECTROCONDUCTIVE POLYMER AND THERMOELECTRIC DEVICE COMPRISING ELECTROCONDUCTIVE POLYMER FILM PREPARED USING THE SAME

(71) Applicant: Industry-Acedemic Cooperation Foundation, Yonsei University, Seoul (KR)

(72) Inventors: Eun Kyoung Kim, Seoul (KR); Tae Hoon Park, Seodaemun-gu (KR); Byeong Gwan Kim, Gyeonggi-do (KR); Hai Jin Shin, Gyeonggi-do (KR); Chi Hyun Park, Gyeonggi-do (KR)

(73) Assignee: Industry-Academic Cooperation Foundation Yonsei University, Seoul (KR)

( * ) Notice: Subject to any disclaimer, the term of this patent is extended or adjusted under 35 U.S.C. 154(b) by 0 days.

(21) Appl. No.: 14/762,522

(22) PCT Filed: Jan. 24, 2013

(86) PCT No.: PCT/KR2013/000562
§ 371 (c)(1),
(2) Date: Sep. 17, 2015

(87) PCT Pub. No.: WO2014/115909
PCT Pub. Date: Jul. 31, 2014

(65) Prior Publication Data
US 2016/0005944 A1    Jan. 7, 2016

(51) Int. Cl.
| | | |
|---|---|---|
| *H01L 35/24* | (2006.01) | |
| *C08G 65/34* | (2006.01) | |
| *C08L 71/08* | (2006.01) | |
| *C08L 101/12* | (2006.01) | |
| *F25B 21/02* | (2006.01) | |
| *H01B 1/12* | (2006.01) | |
| *C08G 81/00* | (2006.01) | |
| *H01L 51/00* | (2006.01) | |

(52) U.S. Cl.
CPC ............. *H01L 35/24* (2013.01); *C08G 65/34* (2013.01); *C08G 81/00* (2013.01); *C08L 71/08* (2013.01); *C08L 101/12* (2013.01); *F25B 21/02* (2013.01); *H01B 1/127* (2013.01); *H01L 51/0036* (2013.01)

(58) Field of Classification Search
CPC ... H01L 35/24; H01L 51/0036; C08G 81/00; C08G 65/34; H01B 1/127; C08L 71/08; C08L 101/12; F25B 21/02
See application file for complete search history.

(56) References Cited

U.S. PATENT DOCUMENTS

2010/0163808 A1* 7/2010 Chen .................... C08G 61/124
252/500

FOREIGN PATENT DOCUMENTS

| KR | 10-0842152 | 6/2008 |
|---|---|---|
| KR | 10-2010-0082679 | 7/2010 |
| KR | 10-2011-0086047 | 7/2011 |
| KR | 10-1082531 | 11/2011 |
| KR | 10-2012-0020582 | 3/2012 |

OTHER PUBLICATIONS

Search Report in International Application No. PCT/KR2013/000562 dated Aug. 27, 2013.

* cited by examiner

*Primary Examiner* — Robert Jones, Jr.
(74) *Attorney, Agent, or Firm* — Marshall, Gerstein & Borun LLP

(57) ABSTRACT

There are provided a method for producing an electroconductive polymer which can be operated at a low temperature such as the human body temperature, is safe to the human body, and is flexible and useful as a thermoelectric material, and a thermoelectric element including a thin film of an electroconductive polymer produced by the production method.

18 Claims, 2 Drawing Sheets
(2 of 2 Drawing Sheet(s) Filed in Color)

METHOD FOR PREPARING ELECTROCONDUCTIVE POLYMER AND THERMOELECTRIC DEVICE COMPRISING ELECTROCONDUCTIVE POLYMER FILM PREPARED USING THE SAME

TECHNICAL FIELD

The present invention relates to a method for producing an electroconductive polymer that is useful as a thermoelectric material, and a thermoelectric element including a thin film of an electroconductive polymer produced by the method.

BACKGROUND ART

Research on the development of substitute energy has been actively conducted in order to cover the ever increasing amount of energy consumption. Commonly known power generation methods such as solar power generation, wind power generation, nuclear power generation, tidal power generation and geothermal power generation have been utilized, and in recent years, attempts have been made to utilize energy sources such as natural energy, bioenergy, and movement or heat of human bodies, as the future energy sources.

In the case of piezoelectric elements, studies have been directed to the applications in which piezoelectric elements are installed in the form of being inserted below the railways or roads so that the pressure exerted on the elements by trains and vehicles passing thereon is converted to energy and used. However, the recent instances of installing piezoelectric elements in subway stations in Japan, dance halls in Europe, and the like are intended to produce energy based on the pressure applied by people walking or running on such elements. It can be said that thermoelectric elements also belong to this category. A thermoelectric material is a material capable of converting heat energy to electric energy. However, while conventional power generation systems are systems for obtaining energy by operating turbines by burning fuels or by utilizing other forms of energy, thermoelectric elements have an advantage that heat can be directly converted to electricity without any additional intermediate processes. It can be said that one of the conditions necessary for electricity generation is heat energy, more specifically, temperature difference, and this implies that heat energy that is wasted in an unusable form in the course of power generation or use of other energy forms can be recycled.

Discovery of such phenomena was made in the early 1800s, and ever since, more specific physical understanding has been gained through extensive studies. Thus, quantitative evaluation criteria have been established for the characteristics of thermoelectric elements, and some of thermoelectric elements have been commercialized and are sold in the market.

The performance of a thermoelectric material, which is the thermoelectric figure of merit, is expressed by $ZT=S^2\sigma/k$. Here, S represents the Seebeck coefficient; a represents electric conductivity; k represents thermal conductivity; and T represents the absolute temperature. The field of application of a thermoelectric material is determined by the extent of this ZT value. At the present, thermoelectric materials having ZT values that slightly exceed 1 are commercialized; however, this requires a temperature condition that is much higher than normal temperature. Thermoelectric elements that have been commercialized as such are based on inorganic semiconductor materials. Recently, active research on composites and nanostructures is ongoing in order to obtain improved thermoelectric characteristics.

Since inorganic semiconductor materials have high thermal stability and can be operated at relatively high temperatures, energy production can be attempted with the inorganic semiconductor materials by utilizing the waste heat produced by automobiles and industrial plants. However, since inorganic semiconductor materials are basically hard and crystalline, production of flexible elements is not feasible, and it is still difficult to solve problems concerning the toxicity of the materials themselves. Recently, studies have also been conducted to produce energy by utilizing not only high temperatures but also the heat produced by the human body. Numerous reports have been made from all over the world on examples of piezoelectric power generation, which is another case of enabling energy production through the energy of human bodies, and in which energy can be produced by utilizing the body weights of people. Use of thermal energy of human bodies requires yet a different approach. The scheme is not to use body weight without any contact of human body as in the case of piezoelectric power generation, but it requires maximal utilization of heat by bringing the material into contact with the human body. Also, it is required that such a material be capable of processing with high flexibility in conformity with the curvatures of the human body. The material should also be able to produce energy, not in an industrial environment that releases high temperature heat, but at a low temperature such as the body temperature. When these conditions are considered, it can be seen that existing inorganic semiconductor materials are not easily applicable due to their toxicity and hardness characteristics. In order to address these problems, research on organic thermoelectric materials is being actively conducted. Among others, studies on electroconductive polymers that can exhibit high thermoelectric performance have been conducted steadily.

Owing to the advantage that electroconductive polymers can substitute inorganic materials at low cost, attention has been paid to the polymers in connection with the applications for organic elements such as organic light emitting diodes, transistors, and organic photovoltaic cells. Since electroconductive polymers are basically organic materials, the structures can be easily modified compared to inorganic semiconductors, and changes in various physical properties can be induced. The most valuable advantage that can be obtained when an electroconductive polymer is utilized as a thermoelectric material is an increase in the ZT value induced by low thermal conductivity. This is because electroconductive polymers essentially have low thermal conductivity, and thus high thermoelectric figures of merit can be obtained. In addition, a thermoelectric composition based on organic materials basically has flexible characteristics, and therefore, the thermoelectric composition is highly advantageous in the production of elements, while element production can be achieved by simpler and inexpensive processes through printing methods. Based on these features, electroconductive polymers are used as thermoelectric composite materials, and are used to increase flexibility of elements. For instance, U.S. Pat. No. 5,472,519 suggests the possibility of using an electroconductive polymer as a thermoelectric material, and a method for producing an element from the polymer, and WO 2010/048066 and WO 2012/115933 suggest electroconductive polymers as supports for thermoelectric composite materials.

In addition to that, investigations have been conducted on the thermoelectric characteristics of nanoparticles and nanowires, and more attention is being paid to the potential of thermoelectric materials as organic nanoparticles and nanowires. For example, electroconductive organic nanowires have been reported in US Patent Application Publication No. 2004/0246650 and U.S. Pat. No. 7,097,757. An advantage of these nanoparticles and nanowires is that a high Seebeck coefficient can be obtained by regulating the state density of the constituent material.

When thermal conductivity is excluded from the thermoelectric figure of merit, efficiency of a thermoelectric composition can be determined through the output factor, which is an evaluation criterion for thermoelectric characteristics. The output factor can be expressed by a product of the square of the Seebeck coefficient and the electrical conductivity. Heretofore, despite their low thermal conductivities, organic thermoelectric compositions have not attracted much attention as thermoelectric materials due to low output factors. For example, Japanese Patent Application Laid-Open No. 2000-323758 describes that when a polyaniline is used as an electroconductive polymer, an enhancement of thermoelectric conversion performance is attempted through lamination, extension or the like; however, the polymer has low thermoelectric conversion performance and is not at a level suitable for practical use. Furthermore, U.S. Pat. No. 5,472,519 describes that poly(3-octylthiophene) as a conductive polymer and iron chloride as a dopant are used at a molar ratio of 2:1; however, the mixture has low electrical conductivity, and the thermoelectric conversion performance is not at a level suitable for practical use. In recent years, more attention is being paid again to electroconductive polymers as thermoelectric materials, owing to improved electrical conductivities attained through active research. Conductive polymers have an advantage that the electrical conductivity and the Seebeck constant values can be regulated by regulating the degree of doping, and thereby changing the carrier concentration. When the carrier concentration increases, increased mobility leads to an increase in electrical conductivity. On the contrary, when the carrier concentration decreases, the Seebeck coefficient is increased. In view of such relationships, reports have been made on studies conducted to obtain the maximum value for the maximum output factor, which is a product of the square of the Seebeck coefficient and the electrical conductivity by regulating the degree of doping (Olga Bubnova, et al., Nature Materials, Vol. 10 (2011), p. 429; and Re'da Badrou Aich, et al., Chem. Mater., Vol. 21 (2009), p. 751). Regarding the method for controlling the degree of doping, there are available a chemical reduction method and an electrochemical reduction method. The studies mentioned above respectively report the use of a chemical reduction method and an electrochemical reduction method. In the study conducted using a chemical reduction method, the output factor value was reported to be 324 $\mu W/mK^2$ at the maximum. However, a chemical reduction method has limitations in precisely controlling the degree of doping of a conductive polymer. The second study in which the output factor is enhanced by an electrochemical reduction method does not provide excellent characteristics of the material itself; however, it is meaningful from the viewpoint that the degree of doping can be accurately controlled. However, there is a restriction that electrochemical reduction methods developed hitherto can be properly carried out only if a substance is formed on an electrically conductive electrode substrate. This implies that in order to actually produce a thermoelectric element by applying an electric reduction method, difficulties in the process associated with the use of an electrode substrate should be overcome somehow. If an electroconductive polymer itself has a sufficiently high electrical conductivity and can be utilized in electrodes, the problems mentioned above can be solved. In the present invention, a method of forming a highly electroconductive polymer film, and increasing the output factor by utilizing the polymer film itself as an electrode, will be explained. The inventors indeed confirmed that energy can be produced by this method through a difference between the skin temperature of the human body and the ambient temperature.

DISCLOSURE OF INVENTION

Problem to be Solved by the Invention

An object of the present invention is to provide a method for producing an electroconductive polymer, intended to produce an electroconductive polymer which can be operated at a low temperature such as the human body temperature, is safe to the human body, and is flexible and useful as a thermoelectric material.

Another object of the present invention is to provide an electroconductive polymer produced by the method described above, and a thermoelectric element including a thin film of the electroconductive polymer.

Means for Solving Problem

In order to achieve the objects described above, according to an aspect of the present invention, there is provided a method for producing an electroconductive polymer, the method including a step of producing an oxidizing solution including an oxidizing agent, a polymerization retarder, a copolymer containing a polyalkylene glycol as a constituent unit, and a solvent; and a step of polymerizing an electroconductive polymer by adding a monomer for forming an electroconductive polymer to the oxidizing solution, and performing solution polymerization, or by applying the oxidizing solution to form a coating film, supplying the vapor of a monomer for forming an electroconductive polymer to the coating film, and performing vapor polymerization.

The oxidizing agent may be any one selected from the group consisting of ammonium persulfate, DL-tartaric acid, polyacrylic acid, copper chloride, ferric chloride, iron p-toluenesulfonate, β-naphthalenesulfonic acid, p-toluenesulfonic acid, camphorsulfonic acid, and mixtures thereof, and it is preferable that the oxidizing agent is included at a proportion of 5% to 50% by weight relative to the total weight of the oxidizing solution.

The polymerization retarder may be a basic substance having a pKa value of 3.5 to 12, and it is preferable that the polymerization retarder is included at a molar ratio of 0.1 to 2 with respect to 1 mole of the oxidizing agent.

The copolymer is preferably a copolymer containing one or more constituent units selected from the group consisting of polyethylene glycol and polypropylene glycol, and it is more preferable that the copolymer is a triblock copolymer of polyethylene glycol-polypropylene glycol-polyethylene glycol.

Furthermore, it is preferable that the copolymer has a weight average molecular weight of 500 to 1,000,000 g/mol, and it is preferable that the copolymer is included at a proportion of 5% to 40% by weight relative to the total weight of the oxidizing solution.

The solvent may be selected from the group consisting of an alcohol-based compound, tetrahydrofuran, dioxin, chloroform, methylene chloride, acetone, methyl ketone, tetrachloroethane, toluene, and mixtures thereof.

The oxidizing solution may further include an additive selected from the group consisting of a polyalkylene glycol, an oxidation inhibitor, a thermal stabilizer, a thickener, and mixtures thereof.

The production method described above may further include, after the polymerization of an electroconductive polymer, a step of regulating the doping amount of the electroconductive polymer by an electrochemical method of using the polymerized electroconductive polymer as an electrode, and applying a voltage thereto in an electrolyte solution.

According to another aspect of the present invention, there is provided an electroconductive polymer produced by the production method described above.

The electroconductive polymer may have an electrical conductivity of 500 S/cm or more.

According to still another aspect of the present invention, there is provided a thermoelectric element including a thin film of an electroconductive polymer produced by the production method described above.

The thermoelectric element may include a substrate, and a thin film of an electroconductive polymer produced by the production method described above, which is disposed on the substrate and is a p-type material, and may further include a thin film of an organic substance or an inorganic semiconductor, which is disposed on the substrate and is an n-type material that is electrically coupled with the thin film of the electroconductive polymer.

The substrate may be a flexible substrate.

Specific matters of other embodiments of the present invention are included in the following detailed description of the invention.

Effect of the Invention

A thermoelectric element produced by using an electroconductive polymer produced by the production method according to the present invention can exhibit a thermoelectric efficiency that has been increased to 3 to 1000 times the thermoelectric efficiency of the conventional organic material-based thermoelectric elements.

BRIEF DESCRIPTION OF DRAWINGS

The patent or application file contains at least one drawing executed in color. Copies of this patent or patent application publication with color drawings will be provided by the Office upon request and payment of the necessary fee.

EXPLANATIONS OF LETTERS OR NUMERALS

Figure 1:
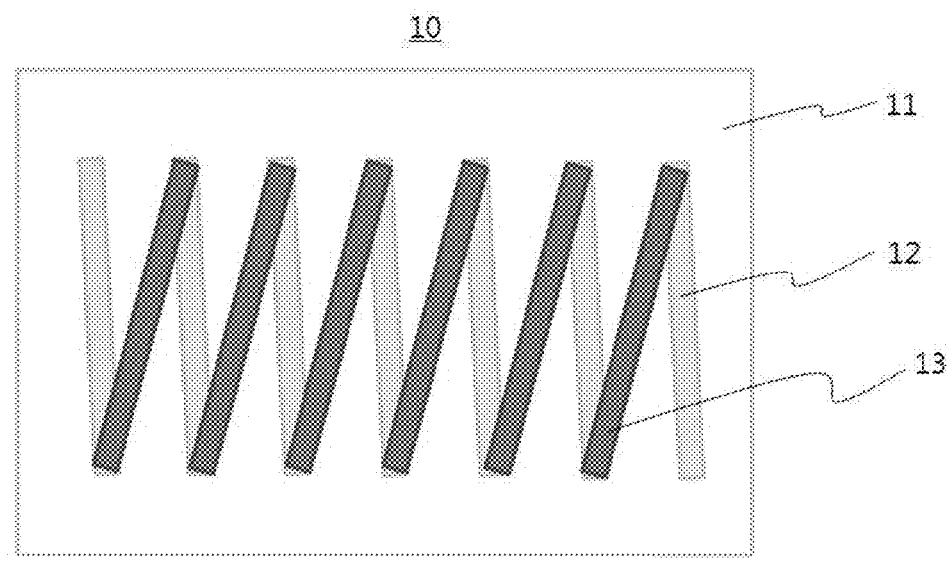
FIG. 1 is a schematic diagram illustrating an outline of the structure of a thin film type thermoelectric element according to an embodiment of the present invention.

10 THIN FILM TYPE THERMOELECTRIC ELEMENT
11 SUBSTRATE
12 ELECTRODE
13 THIN FILM OF ELECTROCONDUCTIVE POLYMER
20 LAMINATE TYPE THERMOELECTRIC ELEMENT
21 SUBSTRATE
22 p-TYPE ELECTROCONDUCTIVE POLYMER FILM
23 n-TYPE CNT FILM
24 p-n JUNCTION

BEST MODE(S) FOR CARRYING OUT THE INVENTION

The present invention may include various modifications and embodiments, and therefore, the present invention will be explained in detail by taking exemplary embodiments. However, this is not intended to limit the present invention to the particular exemplary embodiments, and it should be noted that the present invention is intended to include all variations, equivalents, and substitutions that are included in the technical scope of the idea of the present invention.

The terms and expressions used in the present invention are used only for the purpose of illustrating particular embodiments, and are not intended to limit the present invention. Unless stated otherwise, an expression of singularity is intended to include expressions of plurality. It should be noted that the terms "include" or "have" as used in the present invention are intended to denote the existence of any features, numerical values, steps, operations, constituent elements, parts, and combinations thereof described in the specification, but are not intended to preliminarily exclude the possibility of existence or addition of any one or more other features, numerical values, steps, operations, constituent elements, parts, and combinations thereof.

Electroconductive polymers, particularly oxidatively polymerized type electroconductive polymers, which are mainly used as thermoelectric materials to utilize energy sources such as natural energy, bioenergy, and movement or heat of the human body as electric energy, exhibit different thermoelectric characteristics depending on the degree of doping.

In this regard, the present invention is characterized in that electrical conductivity is increased by regulating the polymerization process for an electroconductive polymer, an electroconductive polymer that has acquired high electrical conductivity as a result is used as an electrode per se to regulate the degree of oxidation, that is, the degree of doping, through a chemical or electrochemical reduction method, and thereby the problem of low electrical conductivity of electroconductive polymers produced by conventional production methods is solved, while a high output factor is exhibited at the time of applying the electroconductive polymer to a thermoelectric element by regulating the electrical conductivity and the Seebeck coefficient.

That is, according to an embodiment of the present invention, there is provided a method for producing an electroconductive polymer, the method including a step of preparing an oxidizing solution including an oxidizing agent, a polymerization retarder, a copolymer containing a polyalkylene glycol as a constituent unit, and a solvent (Step 1); and a step of polymerizing an electroconductive polymer by adding a monomer for forming an electroconductive polymer to the oxidizing solution and performing solution polymerization, or by applying the oxidizing solution to form a coating film, subsequently supplying the vapor of a monomer for forming an electroconductive polymer to the coating film, and performing vapor polymerization (Step 2).

The various steps of the method for producing an electroconductive polymer of the present invention will be explained in detail below.

(Step 1)

Step 1 is a step of preparing an oxidizing solution including an oxidizing agent, a polymerization retarder, a copolymer containing a polyalkylene glycol as a constituent unit, and a solvent.

The oxidizing agent is a substance that induces polymerization of monomers, and can act as a dopant after polymerization of an electroconductive polymer.

Regarding the oxidizing agent, any compound that is used at the time of production of an electroconductive polymer by polymerization can be used without any particular limitations, and among them, the oxidizing agent is preferably selected from the group consisting of ammonium persulfate ($(NH_4)_2S_2O_8$), DL-tartaric acid, polyacrylic acid, copper chloride, ferric chloride, iron p-toluenesulfonate, β-naphthalenesulfonic acid, p-toluenesulfonic acid, camphorsulfonic acid, and mixtures thereof.

The oxidizing agent may be included at a proportion of 5% to 50% by weight relative to the total weight of the oxidizing solution. If the content of the oxidizing agent is less than 5% by weight, the effect obtainable by the addition of an oxidizing agent is negligible, and if the content is more than 50% by weight, there is a risk of the occurrence of side reactions caused by residual unreacted oxidizing agent and the decrease in electrical conductivity of the electroconductive polymer. It is more preferable that the oxidizing agent is included at a proportion of 15% to 45% by weight relative to the total weight of the oxidizing solution.

The polymerization retarder plays the role of complementing low pH, more specifically a low pH such as about pH 1, caused by the oxidizing agent at the time of polymerization of an electroconductive polymer, and particularly in the case of using an iron ion-containing substance as the oxidizing agent, the polymerization retarder plays the role of relatively delaying the action of iron ions, and thereby regulating the polymerization rate such that a polymer having a long chain can be formed by polymerization of monomers.

Regarding the polymerization retarder having such an effect, it is preferable to use a basic substance having a pKa value of 3.5 to 12. If the pKa is less than 3.5, the pH complementing effect is negligible, and regulation of the polymerization rate is difficult. If the pKa exceeds 12, the pH of the oxidizing solution increases excessively, the polymerization reaction is suppressed, and as a result, there is a risk that the electrical conductivity of the electroconductive polymer may be decreased. It is more preferable that the polymerization retarder is a basic substance having a pKa value of 5 to 12.

Specifically, the polymerization retarder may be an amine-based compound having a pKa value in the range described above, or a nitrogen atom-containing saturated or unsaturated heterocyclic compound such as a pyridine-based, imidazole-based, or pyrrole-based compound. More specific examples include an imidazole-based compound represented by the following formula (1), pyridine, piperidine, pyrrolidine, 4-methyl-3-pyridine amine, 4-dimethylaminopyridine, 4-phenylpyridine, 3-(4-pyridinyl)aniline, 4-(4-pyridinyl)aniline, 4-phenyl-2-pyridine amine, N-methyl[4-(4-pyridinyl)phenyl]methaneamine, 4,4'-bipyridyl, 2,2'-dimethyl-4,4'-bipyridine, isoquinoline, 6-isoquinolinylamine, 6-methylisoquinoline, 5-isoquinolinamine, and triethylamine, and it is preferable to use these compounds singly or as mixtures of two or more kinds.

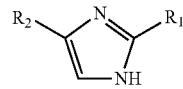

[Chemical Formula 1]

wherein $R_1$ and $R_2$ each independently represent a hydrogen atom or an alkyl group having 1 to 10 carbon atoms, and each of R1 and R2 is any one selected from the group consisting of a hydrogen atom, a methyl group, an ethyl group, a propyl group, and a butyl group.

It is preferable that the polymerization retarder is included at a molar ratio of 0.1 to 2 with respect to 1 mole of the oxidizing agent. If the content of the polymerization retarder with respect to the oxidizing agent is excessively low, that is, if the content is 1:less than 0.1 moles, the pH complementing effect is negligible, a polymer having a short chain is likely to be formed, and as a result, there is a risk that the electrical conductivity improving effect may be negligible. On the other hand, if the content of the polymerization retarder with respect to the oxidizing agent is excessively high, that is, if the content is 1:more than 2 moles, the oxidizing action of the oxidizing agent is suppressed excessively, and a polymerization reaction may not occur easily.

The copolymer containing a polyalkylene glycol as a constituent unit (hereinafter, simply referred to as "copolymer") does not directly participate in the polymerization reaction of an electroconductive polymer; however, the copolymer plays the role of preventing crystallization of the oxidizing agent, helping alignment of the orientation of the electroconductive polymer formed as a result of polymerization, and thereby further increasing the electrical conductivity. For the copolymer, any copolymer containing one or more selected from the group consisting of polyethylene glycol and polypropylene glycol as a constituent unit can be used, and preferably, a triblock copolymer containing one or more selected from the group consisting of polyethylene glycol and polypropylene glycol as constituent units, such as a triblock copolymer of polyethylene glycol-polypropylene glycol-polyethylene glycol, can be used.

Such a copolymer exhibits superior effects in terms of thin film formation and electrical characteristics compared to conventional surfactants that are conventionally used at the time of polymerization of electroconductive polymers, such as polyethylene oxide, sodium dodecyl benzenesulfonate, polyvinyl alcohol, and polyvinylpyrrole.

It is more preferable that the copolymer has a weight average molecular weight (Mw) of 500 to 1,000,000 g/mol. If the weight average molecular weight of the copolymer is less than 500 g/mol, the copolymer cannot significantly participate in morphological changes of the electroconductive polymer, and the electrical characteristics improving effect is negligible. If the weight average molecular weight is more than 1,000,000 g/mol, there is a risk that an excessively large copolymer thus produced may block the conductive channels of the electroconductive polymer.

The copolymer may be included at a proportion of 5% to 40% by weight relative to the total weight of the oxidizing solution. If the content of the copolymer is less than 5% by weight, the effect originating from addition of the copolymer is negligible, and if the content is more than 40% by weight, there is a risk that the copolymer may interrupt the formation of conductive channels of the electroconductive polymer, and there is a risk of the occurrence of side reactions caused by residual unreacted copolymer. It is more preferable that the copolymer is included at a proportion of 9% to 36% by weight relative to the total weight of the oxidizing solution.

For the solvent, alcohol-based compounds including primary or secondary alcohols having 1 to 10 carbon atoms (for example, methanol, ethanol, propanol, butanol, and pentanol); or organic solvents such as tetrahydrofuran, dioxin, chloroform, methylene chloride, acetone, methyl ketone, tetrachloroethane, and toluene can be used, and it is preferable to use these solvents singly or in combination of two or more kinds thereof.

The solvent may be included in an amount that makes up the balance of the oxidizing solution, and in consideration of solubility, miscibility and the like, it is preferable that the solvent is included in an amount of 50% to 80% by weight relative to the total weight of the oxidizing solution.

The oxidizing solution may further include a polyalkylene glycol as an additive.

Specifically, the polyalkylene glycol may be a poly(C2-C6 alkylene) glycol such as polyethylene glycol or polypropylene glycol, and such a compound having a weight average molecular weight of 500 to 1,000,000 g/mol is preferred.

It is preferable that the polyalkylene glycol is included at a proportion of 1% to 40% by weight relative to the total weight of the oxidizing solution.

The oxidizing solution may further include additives that are conventionally used at the time of forming an electroconductive polymer, such as an oxidation inhibitor, a thermal stabilizer, and a thickener, singly or in combination of two or more kinds thereof. The content of the additives can be appropriately determined to the extent that does not deteriorate the effects of the oxidizing solution.

The oxidizing solution can be prepared by mixing an oxidizing agent, a polymerization retarder, a copolymer, a solvent, and optionally a polyalkylene glycol and additives such as described above, according to a conventional method.

(Step 2)

Step 2 is a step of forming an electroconductive polymer by subjecting a monomer for forming an electroconductive polymer to solution polymerization or vapor polymerization, using the oxidizing solution prepared in Step 1.

More specifically, an electroconductive polymer can be formed by adding a monomer for forming an electroconductive polymer to the oxidizing solution prepared in Step 1, and performing solution polymerization; or by applying the oxidizing solution to form a coating film, subsequently supplying the vapor of a monomer for forming an electroconductive polymer to the coating film, and performing vapor polymerization.

The solution polymerization and vapor polymerization can be carried out according to conventional methods. Specifically, in the case of forming an electroconductive polymer by solution polymerization, a monomer for forming an electroconductive polymer is added to the oxidizing solution prepared in Step 1, subsequently a thin film is formed by applying the mixture on a substrate, for example, a glass substrate, a polymer film or a wafer, by various methods such as bar coating, screen printing, inkjet printing, or spin coating, and polymerization is carried out. An electroconductive polymer is produced in the form of a thin film by processes such as described above.

Furthermore, in the case of forming an electroconductive polymer by vapor polymerization, a coating film is formed by applying the oxidizing solution prepared in Step 1 on a substrate, for example, a glass substrate, a polymer film or a wafer, by various methods such as bar coating, screen printing, inkjet printing or spin coating, the coating film thus formed is exposed to the vapor of a monomer for forming an electroconductive polymer, and polymerization is carried out. In the case of performing vapor polymerization as such, since the monomer for forming an electroconductive polymer can be polymerized in the gas phase, the adhesiveness between the substrate and the electroconductive polymer thin film can be further increased, as compared with the case of polymerizing the monomer of an electroconductive polymer and then applying the polymer on a substrate.

At the time of performing the solution polymerization or vapor polymerization, in order to accelerate polymerization, a step of heating the coating film of the oxidizing solution, or the coating film of the oxidizing solution containing a monomer of an electroconductive polymer, at a temperature of 50 □C to 110□ for 5 minutes to 1 hour, can be optionally carried out additionally, and a step of washing the electroconductive polymer in the form of a thin film that has been completely polymerized, with an alcohol-based solvent or distilled water, and drying the thin film, can be optionally carried out additionally.

Regarding the monomer for forming an electroconductive polymer that can be used for the polymerization described above, any monomer that is usually used at the time of forming an electroconductive polymer by oxidation polymerization can be used without any particular limitations. Specifically, aniline or an aniline derivative, pyrrole or a pyrrole derivative, 3,4-ethylenedioxythiophene or a derivative thereof, and the like can be used.

An electroconductive polymer formed by polymerization of monomers such as described above may be polyaniline, polypyrrole, polythiophene, polyethylene dioxythiophene (PEDOT) or a derivative thereof.

The conductive polymer produced as a result of the process of Step 2 can be produced in the form of a thin film. At this time, various substrates such as the glass substrate, wafer or polymer film described above can be used as the supporting substrate for the thin film, and particularly a substrate having flexibility can also be used.

In regard to the production method, by regulating the polymerization process using a copolymer containing a polyalkylene glycol as a constituent unit together with a polymerization retarder, an electroconductive polymer having a higher electrical conductivity compared to electroconductive polymers produced by conventional methods, specifically an electrical conductivity of 500 S/cm or more, can be produced. This is an electrical conductivity that has been improved to about 1.3 to 1,000 times, as compared with the case in which only a polymerization retarder is used.

Known as conventional methods for regulating doping of electroconductive polymers are an electrical method and a chemical method, and among these, an electrical method has an advantage that it is easy to control the doping amount in the electroconductive polymer. Doping of an electroconductive polymer using an electrical method is carried out by positioning the electroconductive polymer on an electrode, for example, an indium tin oxide (ITO) electrode, and then applying an electric current to the electrode. However, since an ITO electrode is not necessary in the case of a thermoelectric element, and since the electrical conductivity of an electroconductive polymer produced by a conventional production method is not sufficiently high so that it is impossible to remove the ITO electrode, electroconductive polymers have been doped mainly by using a chemical method only.

On the contrary, in the present invention, since the electroconductive polymer produced by the production method described above has a markedly increased electrical conductivity, the doping ratio in the electroconductive polymer can be regulated through electrical stimulation using a thin film of the electroconductive polymer itself as an electrode, and particularly, the doping ratio of the electroconductive polymer can be easily regulated so as to obtain an electrical conductivity and a Seebeck coefficient that can exhibit the maximum output factor when the electroconductive polymer is used as a thermoelectric material which utilizes the difference between the body temperature and the ambient temperature.

Accordingly, the method for producing an electroconductive polymer according to the present invention may further include a step of regulating the degree of oxidation, that is, the doping amount, of the electroconductive polymer by an electrochemical method or a chemical method of using a thin film of the electroconductive polymer produced in Step 2 and applying a voltage to the thin film in an electrolyte solution. At this time, the oxidizing agent used at the time of production of the electroconductive polymer plays the role as a dopant.

More specifically, in the case of regulating the doping amount by an electrochemical method, a thin film of the electroconductive polymer produced in Step 2 is immersed as an electrode into an electrolyte solution, and a voltage is applied to the electrolyte solution in a three-electrode state together with a reference electrode (for example, Ag/Ag$^+$) and a counter electrode (for example, platinum (Pt) electrode). Thereby, the degree of oxidation of the electroconductive polymer thin film can be regulated. At this time, if an excessively high voltage is applied, the thin film of the electroconductive polymer may be damaged, and therefore, it is preferable to regulate the degree of oxidation by applying a voltage in the range of −2.5 V to 2.5 V, which does not cause damage to the thin film.

Furthermore, regarding the electrolyte solution, any electrolyte solution that is usually used at the time of doping according to an electrochemical method can be used without any particular limitations. Specifically, an electrolyte solution prepared by dissolving an electrolyte such as tetrabutylamine perchlorate or lithium perchlorate in a solvent such as propylene carbonate or acetonitrile can be used. At this time, the electrolyte solution can contain the electrolyte at a concentration of 0.05 to 1 M, and preferably at a concentration of 0.1 to 0.5 M.

Furthermore, when the doping amount of the thin film of the electroconductive polymer is regulated by a chemical method, the regulation may be carried out by a conventional method. For example, a method of exposing the thin film to the vapor of tetrakis(dimethylamino)ethylene (TDAE) can be used.

From the viewpoint that it is easy to control the doping ratio even in the middle of a doping process for a thin film of an electroconductive polymer such as described above, it is more preferable to use an electrochemical method.

The output factor of a thermoelectric element is expressed as a product of the electrical conductivity and the square of the Seebeck coefficient. Also, an electroconductive polymer is usually such that as the degree of oxidation increases, the carrier concentration is increased, so that the electrical conductivity is increased, and the Seebeck coefficient is decreased. In contrast, if the degree of oxidation decreases, the concentration of carriers is decreased, and the electrical conductivity is decreased, while the Seebeck coefficient is increased. Therefore, when the degree of oxidation, that is, the doping ratio, of the electroconductive polymer is appropriately regulated by an oxidation step such as described above, a thin film of an electroconductive polymer having an electrical conductivity and a Seebeck coefficient that maximize the value of the output factor can be produced.

According to another embodiment of the present invention, there is provided an electroconductive polymer produced by the production method described above, or a thin film containing this polymer.

As described above, an electroconductive polymer produced by the production method described above has a high electrical conductivity, and can be applied to various electronic devices such as a solid electrolytic condenser, an organic EL element, an organic solar cell, an organic transistor, a touch panel, and a battery; or to thermoelectric elements. Furthermore, the electroconductive polymer can have an electrical conductivity and a Seebeck coefficient that maximize the values of the output factor through an oxidation process, and as a result, the electroconductive polymer is particularly useful as a thermoelectric material for thermoelectric elements.

Thus, according to still another embodiment of the present invention, there is provided a thermoelectric element including a thin film of an electroconductive polymer produced by the production method described above.

The thermoelectric element may be an element having a horizontal type, thin film type or laminate type structure, which can be produced by utilizing an electroconductive polymer material which has the output factor increased through doping regulation.

For instance, in a case in which the thermoelectric element has a laminate type structure, the thermoelectric element may include a substrate, and a thin film of the electroconductive polymer that is formed on the substrate and is included as a p-type material, and may optionally further include a thin film of an organic substance or an inorganic semiconductor, which is formed on the substrate and is included as an n-type material that is electrically coupled with the thin film of an electroconductive polymer.

At this time, the substrate may be any of various substrates such as a glass substrate, a wafer and a polymer film, and in the present invention, a substrate having flexibility which can be bent and folded and can be used after being cut to a desired size, can be used by a method for producing an electroconductive polymer through solution polymerization or vapor polymerization described above, can also be used. Regarding the substance for forming a thin film of an organic substance or an inorganic semiconductor, tetrathiofulvalene-tetracyanoquinodimethane, n-type doped carbon nanotubes (CNT), or the like can be used.

A thermoelectric element having such a structure as described above can be produced by a method of forming a thin film of an electroconductive polymer as a thermoelectric material on a substrate by the production method described above, and in a case in which the thermoelectric element further includes an n-type thin film of an organic substance or an inorganic semiconductor, the production method may further include a conventional thin film forming step, for example, a step of forming a thin film of an organic substance or an inorganic semiconductor using a molding method, a micromolding in capillaries (MIMIC), a photolithography method, an inkjet printing method, or the like.

As such, a thermoelectric element having a structure such as described above can be produced by a conventional method, except that a thin film of an electroconductive polymer produced by the above-described production method is used as a thermoelectric material. Thus, in the present specification, the details of the various methods for producing thermoelectric elements having various structures such as a horizontal type structure and a thin film type structure will not be discussed.

In the present invention, production and mass production of a flexible thermoelectric element using a thin film of an electroconductive polymer produced by the production method described above can be achieved.

EXAMPLES

Hereinafter, Examples of the present invention will be described in detail so that a person having ordinary skill in the art to which the present invention is pertained, can easily carry out the invention. However, the present invention can be achieved in various different forms, and is not intended to be limited to the Examples described herein.

Hereinafter, unless particularly stated otherwise, the chemical agents used in Examples and Comparative Examples were purchased from Sigma-Aldrich Co.

Example 1-1

Production of Thin Film of Electroconductive Polymer 4 g of p-toluenesulfonic acid was added to 6 g of butanol and was sufficiently dissolved therein. A solution thus produced was filtered through a filter having a pore size of 0.45 µm, and the filtered solution was collected. Subsequently, 138.5 µl of pyridine and 2 g of a triblock copolymer of polyethylene glycol-polypropylene glycol-polyethylene glycol having a weight average molecular weight of 2800 g/mol were added to the filtered solution thus collected, and the mixture was sufficiently mixed to obtain an oxidizing solution. 331 µl of 3,4-ethylenedioxythiophene was added thereto as a monomer for forming an electroconductive polymer, and the mixture was uniformly mixed.

The mixed solution thus obtained was applied on a glass substrate by spin coating at 1500 rpm, and thus a thin film was formed. The thin film formed on the glass substrate was transferred onto a hot plate heated to 70° C., and polymerization was carried out thereon. After the polymerization reaction was carried out for about 1 hour, it was checked whether the thin film turned from yellow color to dark blue color, and the thin film was cooled to normal temperature. The thin film that had been cooled to normal temperature was washed by immersing the thin film in distilled water, and any remaining solution was blown off using a nitrogen gun. Subsequently, the thin film was heated again at 70° C. for 20 minutes. This process of washing after cooling and heating was repeated two more times, and thus a thin film of an electroconductive polymer was produced.

The thin film of the electroconductive polymer produced as described above was used as an electrode, and this was immersed in a 0.1 M tetrabutylamine perchlorate/propylene carbonate electrolyte solution together with a Ag/Ag+ reference electrode and a platinum (Pt) counter electrode. The thin film of the electroconductive polymer was produced by setting the starting potential at 0.5 V, which was a potential state similar to that of the initial oxidation state of the electroconductive polymer thin film, and varying the potential state at a rate of 0.01 V/s.

The degree of doping of the electroconductive polymer thin film thus produced was checked by X-ray Photoelectron Spectroscopy (XPS).

As a result, the degree of doping of the electroconductive polymer in the initial state was 28% to 30%, and in a state with the highest output factor, the thin film exhibited a degree of doping of 20% to 22%.

Example 1-2

Production of Thin Film of Electroconductive Polymer 4 g of ferric chloride was added to 6 g of ethanol and was sufficiently dissolved therein. A solution thus produced was filtered through a filter having a pore size of 0.45 µm, and the filtered solution was collected. Subsequently, 138.5 µl of pyridine and 2 g of a triblock copolymer of polyethylene glycol-polypropylene glycol-polyethylene glycol having a weight average molecular weight of 5800 g/mol were added to the filtered solution thus collected, and the mixture was sufficiently mixed to obtain an oxidizing solution. 331 µl of 3,4-ethylenedioxythiophene was added thereto as a monomer for forming an electroconductive polymer, and the mixture was uniformly mixed.

The mixed solution thus obtained was applied on a glass substrate by spin coating at 1800 rpm, and thus a thin film was formed. The thin film formed on the glass substrate was transferred onto a hot plate heated to 50° C., and polymerization was carried out thereon. After the polymerization reaction was carried out for about 2 hours, it was checked whether the thin film turned from yellow color to dark blue color, and the thin film was cooled to normal temperature. The thin film that had been cooled to normal temperature was washed by immersing the thin film in ethanol, and any remaining solution was blown off using a nitrogen gun. Subsequently, the thin film was heated again at 70° C. for 10 minutes. This process of washing after cooling and heating was repeated two more times, and thus a thin film of an electroconductive polymer was produced.

Example 1-3

Production of Thin Film of Electroconductive Polymer 4 g of p-toluenesulfonic acid was added to 6 g of ethanol and was sufficiently dissolved therein. A solution thus produced was filtered through a filter having a pore size of 0.45 µm, and the filtered solution was collected. Subsequently, 70 µl of pyridine, 80 µl of imidazole, 2 g of a triblock copolymer of polyethylene glycol-polypropylene glycol-polyethylene glycol having a weight average molecular weight of 2800 g/mol, and 0.5 g of polyethylene glycol having a number average molecular weight of 6000 g/mol as an additive were added to the filtered solution thus collected, and the mixture was sufficiently mixed to obtain an oxidizing solution. 331 µl of 3,4-ethylenedioxythiophene was added thereto as a monomer for forming an electroconductive polymer, and the mixture was uniformly mixed.

The mixed solution thus obtained was applied on a glass substrate by spin coating at 1300 rpm, and thus a thin film was formed. The thin film formed on the glass substrate was transferred onto a hot plate heated to 55° C., and polymerization was carried out thereon. After the polymerization reaction was carried out for about 1 hour, it was checked whether the thin film turned from yellow color to dark blue color, and the thin film was cooled to normal temperature. The thin film that had been cooled to normal temperature was washed by immersing the thin film in distilled water, and any remaining solution was blown off using a nitrogen gun. Subsequently, the thin film was heated again at 70° C.

for 20 minutes. This process of washing after cooling and heating was repeated two more times, and thus a thin film of an electroconductive polymer was produced.

Example 1-4

Production of Thin Film of Electroconductive Polymer 2 g of p-toluenesulfonic acid was added to 8 g of butanol and was sufficiently dissolved therein. A solution thus produced was filtered through a filter having a pore size of 0.45 µm, and the filtered solution was collected. Subsequently, 69.25 µl of pyridine and 1 g of a triblock copolymer of polyethylene glycol-polypropylene glycol-polyethylene glycol having a weight average molecular weight of 2800 g/mol were added to the filtered solution thus collected, and the mixture was sufficiently mixed to obtain an oxidizing solution.

The oxidizing solution produced as described above was applied on a polyethylene terephthalate (PET) substrate by spin coating at 1800 rpm, and thus a thin film was formed. The thin film formed on the PET substrate was transferred onto a hot plate heated to 50° C., and the thin film was heated thereon. After the polymerization reaction was carried out for about 10 minutes, 3,4-ethylenedioxythiophene as a monomer for forming an electroconductive polymer was heated at 70° C., the thin film was introduced into a container filled with 3,4-ethylenedioxythiophene vapor, and polymerization was carried out for 30 minutes. After completion of polymerization, the thin film was washed by immersing the thin film in ethanol, and any remaining solution was blown off using a nitrogen gun. Subsequently, the thin film was heated again at 70° C. for 10 minutes. This process of washing after cooling and heating was repeated two more times, and thus a thin film of an electroconductive polymer was produced.

The electroconductive polymer thin film produced as described above as an electrode, a Ag/Ag+ reference electrode, and a Pt counter electrode were immersed in a 0.1 M lithium perchlorate/acetonitrile electrolyte solution. The thin film of the electroconductive polymer was produced by setting the starting potential at 0.5 V, which was a potential state similar to that of the initial oxidation state of the electroconductive polymer thin film, and varying the potential state at a rate of 0.01 V/s.

Comparative Example 1

Production of Thin Film of Electroconductive Polymer

A thin film of an electroconductive polymer was produced in the same manner as in Example 1-1, except that the amount of pyridine used in Example 1-1 was changed to 277 µl, and the triblock copolymer of polyethylene glycol-polypropylene glycol-polyethylene glycol was not used.

Comparative Example 2

Production of Thin Film of Electroconductive Polymer

A thin film of an electroconductive polymer was produced in the same manner as in Example 1-1, except that the pyridine used in Example 1-1 was not used, and the amount of the triblock copolymer of polyethylene glycol-polypropylene glycol-polyethylene glycol having a weight average molecular weight of 2,800 g/mol was changed to 4 g.

Comparative Example 3

Production of Thin Film of Electroconductive Polymer

A thin film of an electroconductive polymer was produced in the same manner as in Example 1-1, except that 4 g of a polyethylene glycol having a number average molecular weight of 6,000 g/mol was used instead of the triblock copolymer of polyethylene glycol-polypropylene glycol-polyethylene glycol used in Example 1-1.

Test Example 1

The electrical conductivity and the Seebeck coefficient were measured for the electroconductive polymer thin films produced in Examples 1-1 to Example 1-3 and Comparative Examples 1 to 3. The results are presented in Table 1.

TABLE 1

| | Examples | | | Comparative Examples | | |
|---|---|---|---|---|---|---|
| | 1-1 | 1-2 | 1-3 | 1 | 2 | 3 |
| Electrical conductivity (S/cm) | 1360 | 1290 | 1210 | 700 | 600 | 400 |
| Seebeck coefficient (µW/K) | 75 | 73 | 70 | 65 | 68 | 62 |
| Output factor (µW/mK$^2$) | 765 | 687 | 593 | 296 | 277 | 154 |

Test Example 2

At the time of doping regulation for the electroconductive polymer thin films in Examples 1-1 to Example 1-4, the starting potential was set at 0.5 V, and the electrical conductivity and the Seebeck coefficient were measured at an interval of 0.1 V while the potential state was varied at a rate of 0.01 V/s. The results are presented in the following Tables 2 and 3, respectively. The following Tables 2 and 3 present the results of observing changes in the electrical conductivity and the Seebeck coefficient at the time of doping regulation for the electroconductive polymer thin films of Examples 1-1 to Example 1-4.

TABLE 2

| Potential | Electrical conductivity (S/cm) | Error range (S/cm) | Seebeck coefficient (µW/K) | Error range (µW/K) | Output factor (µW/mK$^2$) |
|---|---|---|---|---|---|
| 2 | 720 | 81 | 49 | 1.5 | 173 |
| 1.5 | 1690 | 101 | 49 | 1.3 | 406 |
| 1.3 | 2060 | 141 | 50 | 1.0 | 515 |
| 1.1 | 2120 | 131 | 50 | 0.9 | 530 |
| 0.9 | 1840 | 101 | 50 | 1.2 | 460 |
| 0.7 | 1720 | 99 | 63 | 1.2 | 683 |
| 0.5 | 1350 | 50 | 75 | 1.8 | 759 |
| 0.3 | 1280 | 64 | 96 | 2.1 | 1180 |
| 0.1 | 920 | 45 | 117 | 2.1 | 1260 |
| 0 | 720 | 58 | 127 | 3.0 | 1161 |
| −0.1 | 450 | 41 | 138 | 2.3 | 857 |
| −0.2 | 370 | 49 | 149 | 2.1 | 821 |
| −0.3 | 260 | 40 | 156 | 2.2 | 633 |

TABLE 2-continued

| Potential | Electrical conductivity (S/cm) | Error range (S/cm) | Seebeck coefficient (μW/K) | Error range (μW/K) | Output factor (μW/mK$^2$) |
|---|---|---|---|---|---|
| −0.4 | 220 | 21 | 159 | 5.0 | 556 |
| −0.5 | 140 | 31 | 182 | 6.1 | 464 |
| −0.6 | 100 | 35 | 185 | 5.1 | 342 |
| −0.7 | 110 | 40 | 184 | 6.0 | 372 |
| −0.8 | 90 | 30 | 190 | 7.0 | 323 |
| −0.9 | 100 | 29 | 186 | 6.2 | 346 |
| −1 | 100 | 35 | 186 | 6.7 | 346 |
| −1.5 | 60 | 15 | 192 | 4.6 | 221 |
| −2 | 50 | 11 | 190 | 5.2 | 181 |

TABLE 3

| Potential | Electrical conductivity (S/cm) | Error range (S/cm) | Seebeck coefficient (μW/K) | Error range (μW/K) | Output factor (μW/mK$^2$) |
|---|---|---|---|---|---|
| 2 | 800 | 55 | 50 | 2 | 200 |
| 1.5 | 1750 | 85 | 50 | 1.8 | 438 |
| 1.3 | 2000 | 160 | 50 | 1.5 | 500 |
| 1.1 | 2000 | 153 | 51 | 1.3 | 520 |
| 0.9 | 1700 | 140 | 50 | 2 | 425 |
| 0.7 | 1580 | 120 | 65 | 2.1 | 668 |
| 0.5 | 1200 | 85 | 75 | 2.5 | 675 |
| 0.3 | 1000 | 72 | 95 | 1.8 | 903 |
| 0.1 | 850 | 50 | 115 | 2.3 | 1124 |
| 0 | 700 | 51 | 125 | 2.2 | 1094 |
| −0.1 | 450 | 53 | 135 | 3.1 | 820 |
| −0.2 | 350 | 51 | 146 | 2 | 746 |
| −0.3 | 250 | 58 | 151 | 5.8 | 570 |
| −0.4 | 220 | 46 | 156 | 4.5 | 535 |
| −0.5 | 130 | 53 | 172 | 5.1 | 385 |
| −0.6 | 90 | 38 | 180 | 6.7 | 292 |
| −0.7 | 90 | 45 | 185 | 6.1 | 308 |
| −0.8 | 91 | 42 | 186 | 6.1 | 315 |
| −0.9 | 88 | 37 | 188 | 5.2 | 311 |
| −1 | 90 | 33 | 188 | 4.3 | 318 |
| −1.5 | 70 | 28 | 189 | 5.1 | 250 |
| −2 | 60 | 26 | 190 | 4.7 | 217 |

Example 2-1

Production of Thermoelectric Element

An ITO film substrate was coated with a photoresist (Su-8 2000™ manufactured by MicroChem Corp.), the photoresist was etched through a photomask, and then a gold electrode was deposited thereon. The photoresist was removed so as to leave the deposited gold electrode only, and then a photoresist (Su-8 2000™ manufactured by MicroChem Corp.) was applied on the ITO film substrate. The photoresist was etched using a photomask such that etching occurred only at the two ends of the electrode. The oxidizing solution prepared in Example 1-1 was injected into the space formed as a result of etching, through a printing method, and polymerization was carried out for 2 hours at 60° C., for 2 hours at 80° C., and for 20 minutes at 110° C. When polymerization was completed, any remaining oxidizing agent was removed by washing with distilled water, and a laminate including a thin film of an electroconductive polymer on an ITO substrate was produced.

In order to regulate doping of the electroconductive polymer thin film, the laminate produced as described above as an electrode was immersed, together with a Ag/Ag$^+$ reference electrode, and a Pt counter electrode, into a 0.1 M tetrabutylamine perchlorate/propylene carbonate electrolyte solution. The starting potential was set at 0.45 V, which was a potential state similar to that of the initial oxidation state of the electroconductive polymer thin film, and while the potential state was varied at a rate of 0.01 V/s, voltage application was stopped at 0.1 V. After completion of the doping regulation, the assembly was taken out from the electrolyte solution and washed several times with ethanol.

In the assembly for which the doping regulation had been completed, a tetrathiafulvalene-tetracyanoquinodimethane solution as an n-type organic substance was injected into the space on the other side of the electrode and was cured. Finally, a gold electrode was formed through a photoresist pattern so as to enable coupling of the two substances, and thereby a thermoelectric element was produced.

Example 2-2

Production of Thermoelectric Element

A thermoelectric element was produced in the same manner as in Example 2-1, except that the laminate was exposed for 10 minutes to the vapor of TDAE (tetrakis(dimethylamino)ethylene) in order to regulate the doping ratio of the laminate produced in Example 2-1.

Test Example 3

For the thermoelectric elements produced in Example 2-1 and Example 2-2, the number of p-n junctions per unit area, the output power per unit area, and the total output power were measured.

More specifically, for the number of p-n junctions per unit area, the pair number of the electroconductive polymer used as a p-type material and tetrathiafulvalene-tetracyanoquinodimethane used as a n-type material was calculated, and the output power per unit area and the total output power were calculated by measuring the output power generated at the two ends of a thermoelectric element using a multimeter. The measurement results are presented in the following Table 4.

TABLE 4

| | Number of p-n junctions per unit area (junctions/cm$^2$) | Output power per unit area (nW/cm$^2$) | Total output power (4 × 4 cm$^2$) (nW/cm$^2$) |
|---|---|---|---|
| Example 2-1 | 50 | 98 | 1427 |
| Example 2-2 | 30 | 56 | 814 |

Examples 3-1 to 3-3

Production of Thin Film Type Thermoelectric Element

As illustrated in FIG. 1, a silver paste was applied on a PET substrate (11) at a predetermined interval by a screen printing method, and thus plural stripe-patterned electrodes (12) were formed. A thin film (13) of each of the electroconductive polymers produced in Example 1-1 to Example 1-3 was cut to a size of 6 mm in width and 30 mm in length, and then the electrodes were joined such that one end of one electrode and the opposite end of an adjacent electrode were connected in a zigzag form as illustrated in FIG. 1. Thus, thin film type thermoelectric elements including thin films of the electroconductive polymers produced in Examples 1-1 to 1-3 were produced.

Example 4

Production of Thin Film Type p-n Junction Thermoelectric Element

For the production of a thin film type p-n junction element, an electroconductive polymer as a p-type material and a CNT having modified characteristics as a n-type material were prepared by the method described below.

More specifically, 20 mg of CNT was added to water together with 60 mg of SDS (sodium dodecyl sulfonate), and the mixture was dispersed by an ultrasonication treatment. Subsequently, the CNT dispersed solution was dropped on paper and dried, and excess SDS was washed away with water. This operation was repeated several times so as to obtain a surface resistance of 200 Ω/cm² or less, and then the CNT paper thus produced was immersed in a 1 M $NaBH_4$ solution for 12 hours so that the CNT paper would be changed to have n-type characteristics.

Also, an electroconductive polymer thin film was produced in the same manner as in Example 1, except that a PET film having a thickness of 50 μm was used as a substrate, and 3,4-ethylenedioxythiophene, which is a monomer for forming polyethylenedioxythiophene (PEDOT), was used as the monomer for forming an electroconductive polymer. For the electroconductive polymer thin film thus produced, doping was regulated by the same method as that used in Example 1, and thus a p-type electroconductive polymer thin film was produced.

The p-type electroconductive polymer thin film produced as described above, and the CNT paper prepared as an n-type material were dried for 1 hour at 50° C.

Figure 2:
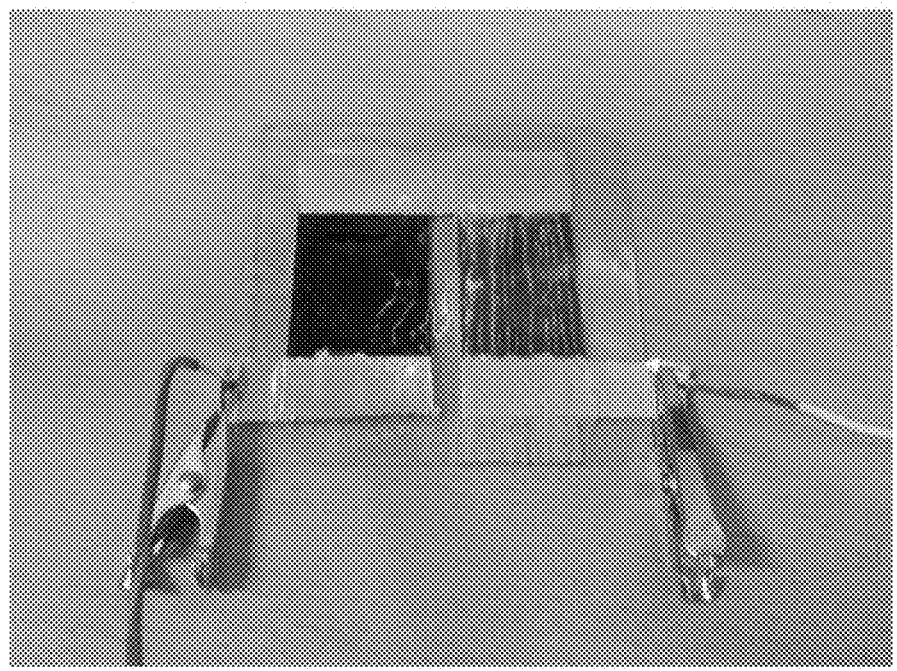
FIG. 2 is a photograph showing an observation of a thin film type p-n junction thermoelectric element produced in Example 4.

An aluminum foil was used as an electrode, and the electroconductive polymer thin film and CNT dried as described above were connected using an adhesive. At this time, the assembly was dried in an oven at 80° C. for 5 hours in order to completely harden a silver adhesive. The resultant thus produced was sandwiched between laminate films, the assembly was perfectly sealed by a heat treatment, and thus a thin film type p-n junction element was produced (see FIG. 2).

Example 5

Laminate Type Thermoelectric Element

Figure 3:
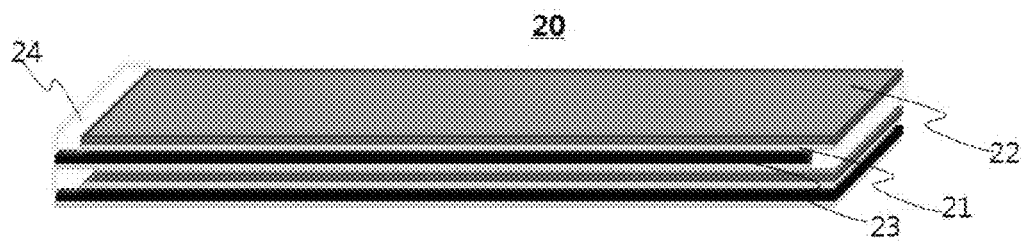
FIG. 3 is a schematic diagram illustrating an outline of the structure of a laminate type thermoelectric element according to another embodiment of the present invention.

FIG. 3 is a schematic diagram illustrating an outline of the structure of a laminate type thermoelectric element according to another embodiment of the present invention. The blue substrate in FIG. 3 represents a p-type electroconductive polymer film (22), the grey substrate represents a PET substrate (21), and a black substrate represents a n-type CNT film (23). For the production of a laminate type thermoelectric element (20) having the structure shown in FIG. 3, a p-type electroconductive polymer film (22) and a n-type film (23) were prepared by the following method.

More specifically, an electroconductive polymer thin film was produced in the same manner as in Example 2, except that a PET substrate (21) having a thickness of 30 □m was used. For the regulation of doping of the electroconductive polymer, the electroconductive polymer thin film produced as described above was immersed as an electrode, together with a $Ag/Ag^+$ reference electrode, and a Pt counter electrode, into a 0.1 M tetrabutylamine perchlorate/propylene carbonate electrolyte solution. Subsequently, the starting potential was set at 0.5 V, which was a potential state similar to that of the initial oxidation state of the electroconductive polymer thin film, and doping was regulated to 0.1 V by varying the potential state at a rate of −0.01 V/s. Thus, a p-type electroconductive polymer thin film (22) was produced.

For the n-type CNT film (23), 20 mg of CNT and 60 mg of SDS (sodium dodecyl sulfonate) were added to water, and the mixture was dispersed by an ultrasonication treatment. Subsequently, the CNT dispersed solution was filtered through a polytetrafluoroethylene (PTFE) filter, and excess SDS was washed away several times with water. The operation described above was repeated several times so as to obtain a surface resistance of 200 Ω/cm² or less, and then the n-type CNT film formed on the PTFE was immersed for 12 hours in a solution prepared by adding 1 ml of a 5 wt % aqueous solution of polyethyleneimine to 30 ml of a 1 M NaBH4 solution to increase the absolute value of the Seebeck coefficient and to also change the characteristics to n-type characteristics.

The n-type CNT film (23) produced as described above was cut to a size of 4 cm in width and 1 cm in length, and the electroconductive polymer thin film (22) with regulated doping formed on the PET substrate (21) was also cut to the same size. The films were stacked layer by layer, and p-n junctions (24) were formed using a silver paste such that p-n junctions were formed at one end. Thus, a laminate type thermoelectric element (20) was produced.

Thus, embodiments of the present invention have been explained; however, any person having ordinary skill in the pertinent art can modify and change the present invention in various ways by means of addition, alteration, deletion or substitution of constituent elements within the scope of the idea of the present invention described in the claims, and these variations and modifications should be construed to be also included in the scope of rights of the present invention.

INDUSTRIAL APPLICABILITY

An electroconductive polymer produced by the production method of the present invention has a high electrical conductivity and can be applied to various electronic devices such as solid electrolytic condensers, organic EL elements, organic solar cells, organic transistors, touch panels, and batteries; and to thermoelectric elements. Also, the electroconductive polymer has an electrical conductivity and a Seebeck coefficient that can maximize the value of the output factor through an oxidation process, and as a result, the electroconductive polymer is particularly useful as a thermoelectric material for thermoelectric elements.

The invention claimed is:

1. A method for producing an electroconductive polymer, the method comprising:
   a step of preparing an oxidizing solution including an oxidizing agent, a polymerization retarder, a copolymer containing a polyalkylene glycol as a constituent unit, and a solvent; and
   a step of polymerizing an electroconductive polymer by adding a monomer for forming an electroconductive polymer to the oxidizing solution and performing solution polymerization, or by applying the oxidizing solution to form a coating film, subsequently supplying the vapor of a monomer for forming an electroconductive polymer to the coating film, and performing vapor polymerization.

2. The method for producing an electroconductive polymer according to claim 1, wherein the oxidizing agent is selected from the group consisting of ammonium persulfate, DL-tartaric acid, polyacrylic acid, copper chloride, ferric chloride, iron toluenesulfonate, β-naphthalenesulfonic acid, p-toluenesulfonic acid, camphorsulfonic acid, and mixtures thereof.

3. The method for producing an electroconductive polymer according to claim 1, wherein the oxidizing agent is included at a proportion of 5% to 50% by weight relative to the total weight of the oxidizing solution.

4. The method for producing an electroconductive polymer according to claim 1, wherein the polymerization retarder is a basic substance having a pKa value of 3.5 to 12.

5. The method for producing an electroconductive polymer according to claim 1, wherein the polymerization retarder is included at a molar ratio of 0.1 to 2 with respect to 1 mole of the oxidizing agent.

6. The method for producing an electroconductive polymer according to claim 1, wherein the copolymer is a copolymer containing one or more selected from polyethylene glycol and polypropylene glycol as constituent units.

7. The method for producing an electroconductive polymer according to claim 1, wherein the copolymer is a triblock copolymer of polyethylene glycol-polypropylene glycol-polyethylene glycol.

8. The method for producing an electroconductive polymer according to claim 1, wherein the copolymer has a weight average molecular weight of 500 to 1,000,000 g/mol.

9. The method for producing an electroconductive polymer according to claim 1, wherein the copolymer is included at a proportion of 5% to 40% by weight relative to the total weight of the oxidizing solution.

10. The method for producing an electroconductive polymer according to claim 1, wherein the solvent is selected from the group consisting of an alcohol-based compound, tetrahydrofuran, dioxin, chloroform, methylene chloride, acetone, methyl ketone, tetrachloroethane, toluene, and mixtures thereof.

11. The method for producing an electroconductive polymer according to claim 1, wherein the oxidizing solution further includes an additive selected from the group consisting of a polyalkylene glycol, an oxidation inhibitor, a thermal stabilizer, a thickener, and mixtures thereof.

12. The method for producing an electroconductive polymer according to claim 1, wherein after polymerization of the electroconductive polymer, a doping amount of the electroconductive polymer is regulated by an electrochemical method of using the polymerized electroconductive polymer as an electrode and applying a voltage thereto in an electrolyte solution.

13. An electroconductive polymer produced by the production method according to claim 1.

14. The electroconductive polymer according to claim 13, having an electrical conductivity of 500 S/cm or more.

15. A thermoelectric element comprising a thin film of an electroconductive polymer produced by the production method according to claim 1.

16. The thermoelectric element according to claim 15, wherein the thermoelectric element comprises a substrate; and disposed on the substrate, the thin film of an electroconductive polymer as a p-type material.

17. The thermoelectric element according to claim 15, further comprising a thin film of an organic substance or an inorganic semiconductor, which is disposed on the substrate and is a n-type material that is electrically coupled with the thin film of the electroconductive polymer.

18. The thermoelectric element according to claim 15, wherein the substrate has flexibility.

* * * * *